(12) United States Patent
Asaumi et al.

(10) Patent No.: US 7,658,120 B2
(45) Date of Patent: Feb. 9, 2010

(54) MAGNETOSTRICTIVE TORQUE SENSOR

(75) Inventors: Hisao Asaumi, Kawachi-gun (JP); Hitoshi Harata, Utsunomiya (JP)

(73) Assignee: Honda Motor Co., Ltd., Tokyo (JP)

( * ) Notice: Subject to any disclaimer, the term of this patent is extended or adjusted under 35 U.S.C. 154(b) by 0 days.

(21) Appl. No.: 12/188,773

(22) Filed: Aug. 8, 2008

(65) Prior Publication Data

US 2009/0049931 A1     Feb. 26, 2009

(30) Foreign Application Priority Data

Aug. 24, 2007   (JP) ............................. 2007-218295

(51) Int. Cl.
 *G01L 3/10*     (2006.01)
(52) U.S. Cl. .............................................. 73/862.333
(58) Field of Classification Search ............ 73/862.331, 73/862.333, 862.335
 See application file for complete search history.

(56) References Cited

U.S. PATENT DOCUMENTS

| | | |
|---|---|---|
| 3,515,985 A | 6/1970 | Guillemin |
| 5,744,956 A | 4/1998 | Hawks |
| 7,478,568 B2 * | 1/2009 | Yoneda et al. ......... 73/862.333 |
| 7,497,132 B2 * | 3/2009 | Harata et al. .......... 73/862.335 |
| 7,506,554 B2 * | 3/2009 | Shimizu et al. ........ 73/862.331 |
| 7,533,757 B2 * | 5/2009 | Sugitani et al. ............. 180/402 |
| 2002/0162403 A1 | 11/2002 | Cripe |
| 2004/0050181 A1 * | 3/2004 | Shimizu et al. ........ 73/862.331 |
| 2005/0218891 A1 | 10/2005 | Viola |
| 2007/0240523 A1 | 10/2007 | Yoneda et al. |
| 2007/0283768 A1 * | 12/2007 | Yoneda et al. ......... 73/862.333 |

FOREIGN PATENT DOCUMENTS

| | | |
|---|---|---|
| JP | 2005-321316 A | 11/2005 |
| JP | 2007-263873 A | 10/2007 |

* cited by examiner

*Primary Examiner*—Lisa M Caputo
*Assistant Examiner*—Freddie Kirkland, III
(74) *Attorney, Agent, or Firm*—Arent Fox LLP.

(57) ABSTRACT

A magnetostrictive torque sensor of the present invention is provided with: a magnetostrictive film; a detection coil; a current direction switching device; and an inversion device, wherein: when the current flows in a direction from one side to another side of the detection coil by the current direction switching device, the torque reacted to the shaft is detected based on the input signal of the inversion device; and when the current flows in a inverse direction from another side to one side of the detection coil by the current direction switching device, the torque reacted to the shaft is detected based on the output signal of the inversion device.

4 Claims, 4 Drawing Sheets

MAGNETOSTRICTIVE TORQUE SENSOR

BACKGROUND OF THE INVENTION

Priority is claimed on Japanese Patent Application No. 2007-218295, filed on Aug. 24, 2007, the contents of which are incorporated herein by reference.

1. Field of the Invention

This invention is related to a magnetostrictive torque sensor.

2. Description of Related Art

Conventionally, there is known a magnetostrictive torque sensor, which detects a torque acted to the rotating shaft of a steering device of a vehicle, using a magnetostrictive film which has magnetic anisotropy and a coil (for example, refer to Japanese Unexamined Patent Application, First Publication No. 2005-321316).

This magnetostrictive torque sensor repeatedly energizes and disconnects a detection coil by using a switching element, and maintains a voltage between the earths of the detection coils by a peak or trough hold circuit during energization, and detects the torque acted to the shaft based on an output signal of the hold circuit.

However, in the above conventional magnetostrictive torque sensor using the hold circuit, generally, there is a resistor or a capacitor between the earths on the input side so as to obtain a good detection characteristics by suppressing disturbances to an input signal. Therefore, there is a problem in which the level of detection voltage on the input side of the hold circuit goes down due to the resistor or the capacitor.

In addition, since the output side of the hold circuit becomes high impedance state in order to maintain detection sensitivity, the output signal is disadvantageously affected by disturbances such as a static electricity or a radio transmission.

The present invention was made in view of the above-mentioned circumstances and has an object of providing a magnetostrictive torque sensor which can suppress the effect of disturbances without reducing detection sensitivity.

SUMMARY OF THE INVENTION

In order to solve the above problems and achieve the above object, the present invention employs the followings.

That is, the magnetostrictive torque sensor is provided with: a magnetostrictive film for which magnetic properties change in response to a magnitude of a torque acted to a shaft; a detection coil which detects variation of the magnetic properties of the magnetostrictive film; a current direction switching device which can invert a direction of a current which flows to the detection coil with respect to each predetermined time; and an inversion device which synchronizes with an inversion timing of the current by the current direction switching device and inverts a detection signal of the detection coil, wherein: when the current flows in a direction from one side to another side of the detection coil by the current direction switching device, the torque acted to the shaft is detected based on an input signal of the inversion device; and when the current flows in an inverse direction from another side to one side of the detection coil by the current direction switching device, the torque acted to the shaft is detected based on an output signal of the inversion device.

According to the above magnetostrictive torque sensor, when current flows in the direction from one side to another side by the current direction switching device, by detecting the torque based on the output signal of the inversion device, regardless of the ON/OFF switching by the current direction switching device, it is possible to detect the torque based on a constant voltage signal. Therefore, since it is possible to omit a hold circuit, it is possible to prevent sensitivity reduction of the detection signal.

In addition, when using the hold circuit, the output side becomes high impedance state and susceptible to disturbances. On the other hand, in the present invention, since an output of the detection coil can be output as a constant voltage without a hold circuit, it is not required to endow the output side circuit with high impedance. Consequently, disturbances affecting the output signal can be suppressed.

According to the magnetostrictive torque sensor, the current direction switching device may set one period to be longer than another period, either a period when the current flows in the direction from one side to another side of the detection coil, or a period when the current flows in the inverse direction from another side to one side of the detection coil.

In this case, any one of the periods either the period when the current flows in the direction from one side to another side of the detection coil or the period when the current flows in the inverse direction from another side to one side of the detection coil is longer than another period. Therefore, in addition to the previously described advantage described above, it is possible to superimpose a direct current component on the current which flows in the detection coil. Therefore, it is possible to continuously apply a bias magnetic field to the shaft. Consequently, it is possible to apply to act a bias magnetic field that is stronger than the effect of the earth magnetism depending on destinations where magnetic orientations are different on the surface of the earth, for example, in the northern hemisphere or the southern hemisphere. Accordingly, since the direction of the torque which is detected by the detection coil is not inversed by the effect of the earth magnetism, it is possible to detect the torque with higher reliability.

The magnetostrictive torque sensor according to the present invention may be further provided with a buffer which disconnects circuit between the inversion device and the detection coil.

The magnetostrictive torque sensor according to the present invention may be further provided with a differential amplifier which differentially amplifies the detection signal that has passed through the inversion device; and a buffer which disconnects circuit between the differential amplifying device and the inversion device.

DETAILED DESCRIPTION OF THE INVENTION

Hereunder is a description of a magnetostrictive torque sensor according to an embodiment of the present invention, with reference to accompanying drawings.

In this embodiment, one example of a magnetostrictive torque sensor which is used in an electrical power-steering device for a vehicle is explained. Moreover, the electrical power-steering device of the embodiment drives a motor (not illustrated in the FIGURES) based on a detection result of the magnetostrictive torque sensor and applies a predetermined torque to the steering.

Figure 1:
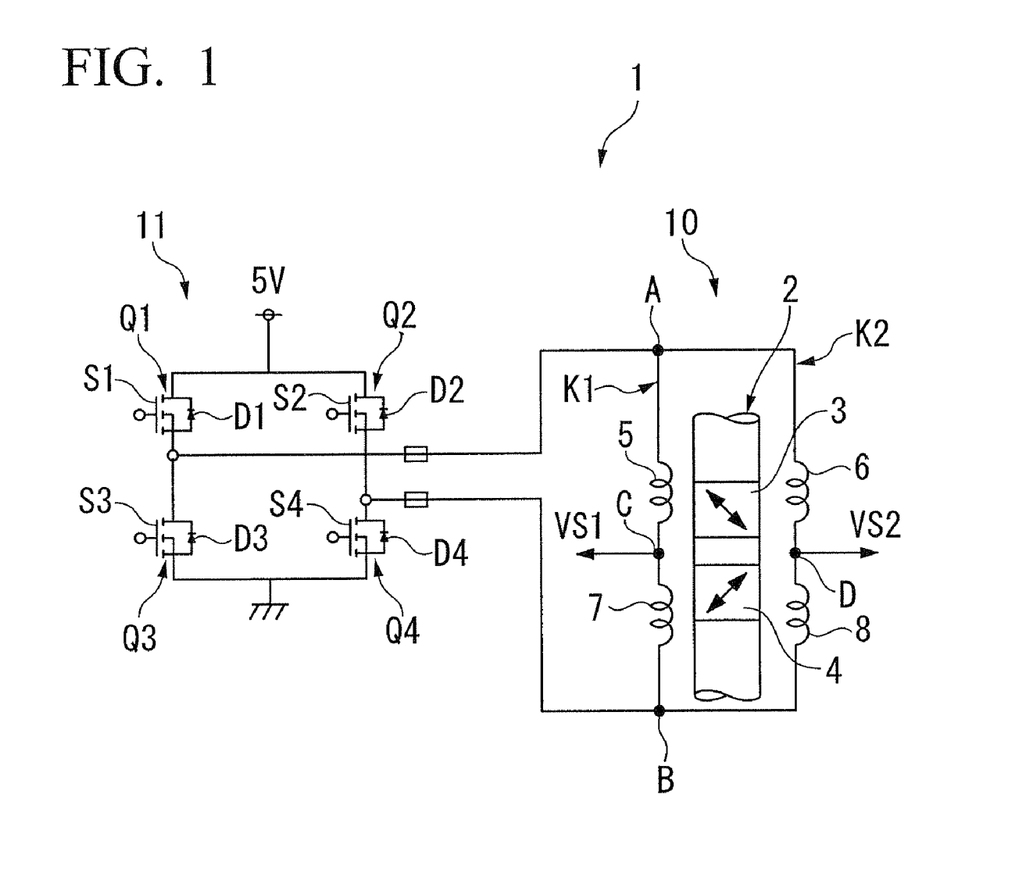
FIG. 1 is a circuit structural view showing a detection section of a magnetostrictive torque sensor and a bridge circuit related to an embodiment of the present invention.

FIG. 1 shows a magnetostrictive torque sensor 1 used for steering torque detection. The magnetostrictive torque sensor 1 is provided with a first magnetostrictive film 3 and a second magnetostrictive film 4 which are provided on a rotating shaft 2 which is connected to a handle (not illustrated in the FIGURES). The first magnetostrictive film 3 and second magnetostrictive film 4 are arranged respectively in parallel in the direction of the axis of the rotating shaft 2.

The first magnetostrictive film 3 and the second magnetostrictive film 4 are metal films formed of material which has large variation in magnetic permeability with respect to strain. The metal films are formed of alloy films of the Ni—Fe series by a plating method on the outer periphery of the rotating shaft 2.

The first magnetostrictive film 3 has magnetic anisotropicity with a direction of easy magnetization which is set in an approximately 45° sloping direction to the axis line of the rotating shaft 2. While, the second magnetostrictive film 4 also has magnetic anisotropicity and the direction of easy magnetization of the second magnetostrictive film 4 is set in a direction of 90° with respect to the direction of easy magnetization of the first magnetostrictive film 3.

When a compression force and a tensile force are acted along the direction of easy magnetization of the first magnetostrictive film 3 and the second magnetostrictive film 4, the magnetic permeability significantly increases and decreases in response to the compression force and the tensile force. If a right or left rotating torque acts to the rotating shaft 2, a compression force acts along the direction of easy magnetization of the one film which is either the first magnetostrictive film 3 or the second magnetostrictive film 4, and at the same time, a tensile force acts along the direction of easy magnetization of another film which is either the first magnetostrictive film 3 or the second magnetostrictive film 4. Accordingly, a magnetic permeability of the one film which is either the first magnetostrictive film 3 or the second magnetostrictive film 4 increases and the magnetic permeability of the other decreases.

A first detection coil 5 and a second detection coil 6 are arranged facing one another with a specific gap between them on the first magnetostrictive film 3. While, a third detection coil 7 and a fourth detection coil 8 are arranged facing one another with a specific gap between them on the second magnetostrictive film 4. The first detection coil 5 and the third detection coil 7 are serially connected and the second detection coil 6 and the fourth detection coil 8 are serially connected, and both of these serial connections connected in parallel. Thus, the detection section 10 is provided with of the first detection coil 5 to the fourth detection coil 8 which are connected in the above manner.

The first detection coil 5 to the fourth detection coil 8 detect the variation in magnetic permeability of the first magnetostrictive film 3 and the second magnetostrictive film 4 as described above. When the magnetic permeability of the first magnetostrictive film 3 changes, an inductance of the first detection coil 5 and the fourth detection coil 8 which are arranged along the direction of easy magnetization of the first magnetostrictive film 3 increases or decreases, and when the magnetic permeability of the second magnetostrictive film 4 changes, an inductance of the second detection coil 6 and the third detection coil 7 which are arranged along the direction of easy magnetization of the second magnetostrictive film 4 increases or decreases.

The detection section 10 is connected to the electrical source 5V through a bridge circuit 11. The bridge circuit 11 is an inverter which functions as a so-called H-bridge, and is provided with a first arm Q1 to a fourth arm Q4. The first arm Q1 to the fourth arm Q4 are respectively provided with the first switching element S1 to the fourth switching element S4 such as FET respectively and diodes D1 to D4 for protection which are connected so as to become forward directed towards a drain from a source of these the first switching element S1 to the fourth switching element S4. The first switching element S1 to the fourth switching element S4 are Normally-OFF type FET, and when an ON signal is input to a gate, there between the source and the drain becomes conduction state, and when an OFF signal is input, an insulating condition is maintained between the source and the drain. Moreover, in the embodiment, the case that a electrical source voltage is 5V is explained, but the electrical source voltage is not limited just 5V.

The bridge circuit 11 is configured so that the first arm Q1 and the third arm Q3 are serially connected and the second arm Q2 and the fourth arm Q4 are serially connected, and both of these serial connections connected in parallel between the electrical source 5V and ground. The first switching element S1 to the fourth switching element S4 which form the first arm Q1 to the fourth arm Q4 are connected to the non-illustrated electronic control unit (ECU), and based on a control signal from the electronic control unit, each switching control for the first switching element Si to the fourth switching element S4 of the first arm Q1 to the fourth arm Q4 is performed.

In the control of the first switching element S1 to the fourth switching element S4 of the first arm Q1 to the fourth arm Q4 by the electronic control unit, switching actions of the first switching element S1 of the first arm Q1 and the fourth switching element S4 of the fourth arm Q4 are simultaneously performed, and switching of the second switching element S2 of the second arm Q2 and the third switching element S3 of the third arm Q3 are simultaneously performed. When the first switching element S1 of the first arm Q1 and the fourth switching element S4 of the fourth arm Q4 are controlled to be opened, the second switching element S2 of the second arm Q2 and the third switching element S3 of the third arm Q3 are controlled to be closed. While, when the second switching element S2 of the second arm Q2 and the third switching element S3 of the third arm Q3 are controlled to be opened, the first switching element S1 of the first arm Q1 and the fourth switching element S4 of the fourth arm Q4 are controlled to be closed. One end (point A) of the detection section 10 is connected between the first arm Q1 and the third arm Q3, and the other end (point B) of the detection section 10 is connected between the second arm Q2 and the fourth arm Q4.

That is, when the first switching element S1 of the first arm Q1 and the fourth switching element S4 of the fourth arm Q4 are controlled to be opened and the second switching element S2 of the second arm Q2 and the third switching element S3 of the third arm Q3 are controlled to be closed, a current flowing from the plus side of the electrical source flows to the detection section 10 via the first arm Q1. Furthermore, the current diverges at the point A of the detection section 10, and each diverged current flows through the path K1 where the first detection coil 5 and the third detection coil 7 are serially connected and flows through the path K2 where the second detection coil 6 and the fourth detection coil 8 are serially connected. Afterwards, the two diverged currents merge at the point B of the detection section 10 and the merged current returns to the ground side (that is, the minus side of the electrical source) via the fourth arm Q4.

Conversely, when the switching element S1 of the first arm Q1 and the fourth switching element S4 of the fourth arm Q4 are controlled to be closed and the switching element S2 of the second arm Q2 and the third switching element S3 of the third arm Q3 are controlled to be opened, a current flowing from the plus side of the electrical source flows to the detection section 10 via the second arm Q2. Furthermore, the current diverges at the point B of the detection section 10, and each diverged current flows through the respective paths K1 and K2. Afterwards, the two diverged currents merge at the point A and the merged current returns to the ground side (that is, minus side of the electrical source) via the third arm Q3.

When the detection section 10 is energized by the above described bridge circuit 11, it is possible to obtain a detection voltage VS1 between: the ground which is the reference potential; and a point C between the first detection coil 5 and the third detection coil 7 of the detection section 10. In addition, it is possible to obtain a detection voltage VS2 between: the ground which is the reference potential; and a point D between the second detection coil 6 and the fourth detection coil 8. Incidentally, the reference potential is not limited to ground.

Figure 2:
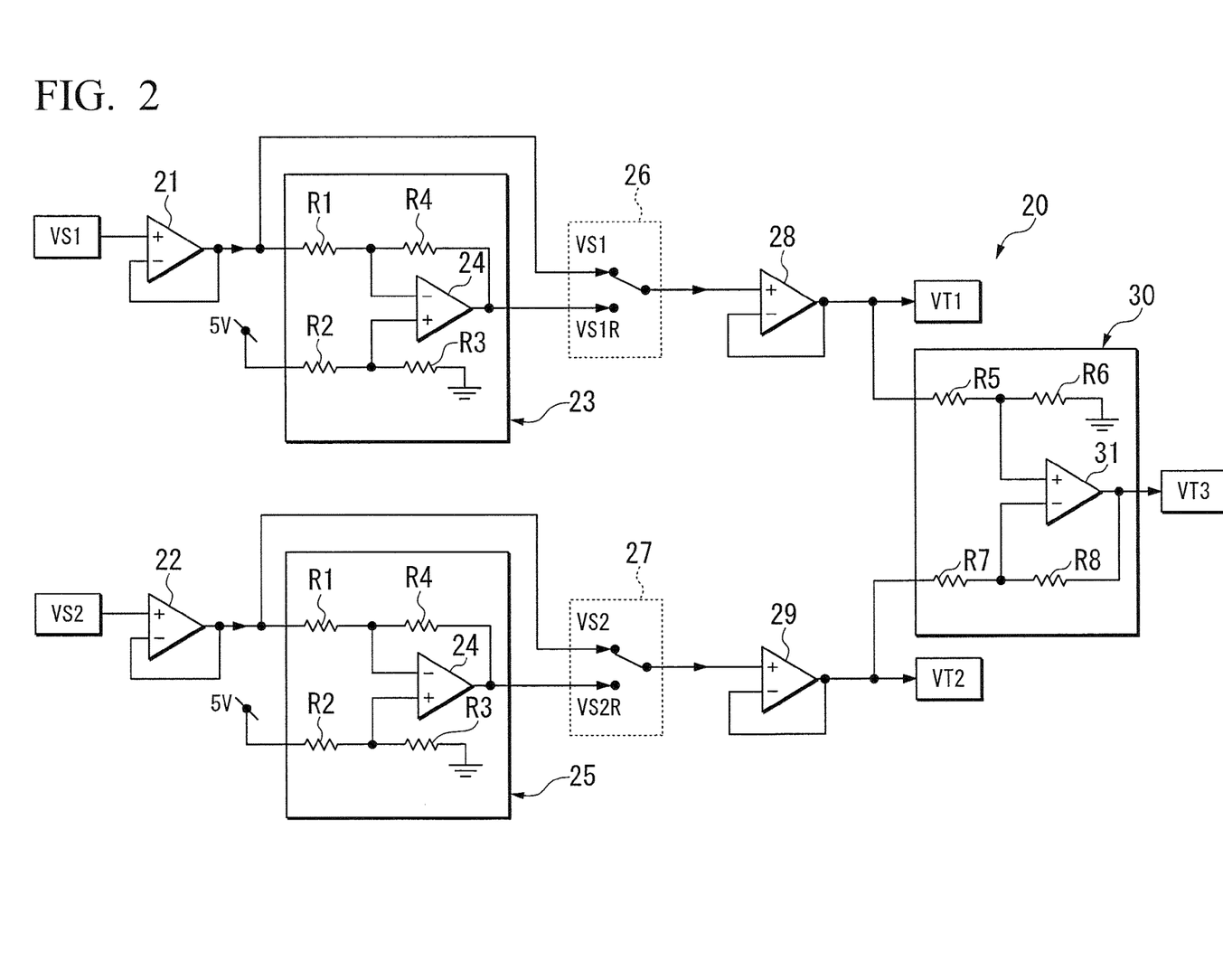
FIG. 2 is a circuit structural view showing a waveform shaping circuit related to the embodiment.

FIG. 2 shows the waveform shaping circuit 20 which obtains a detection signal so as to detect a torque acted to the rotating shaft 2 by respectively processing the detection voltage VS1 and the detection voltage VS2 which are obtained from the detection section 10 as described above. The waveform shaping circuit 20 includes a first buffer 21 to which the detection voltage VS1 is input and a second buffer 22 to which the detection voltage VS2 is input in previous step. The detection section 10 and the waveform shaping circuit 20 are disconnected electrically so as not to affect each other by the first buffer 21 and the second buffer 22. That is, the first buffer 21 and the second buffer 22 which disconnect circuit between: the first inverting circuit 23 and the second inverting circuit 25; and the first detection section 5 to the fourth detection coil 8.

The first inverting circuit 23 which outputs by inverting the detection voltage VS1 is connected to the first buffer 21. The first inverting circuit 23 is principally provided with an operational amplifier 24. The output terminal of the first buffer 21 is connected to a plus terminal of the operational amplifier 24 via the first resistance R1. That is, the detection voltage VS1 is applied to a minus terminal of the operational amplifier 24 via the first resistance R1. While, a voltage (for example, 2.5V), which is divided from an electrical source voltage 5V by the second resistance R2 and the third resistance R3 which are equivalent resistance value as the intermediate voltage between the electrical source 5V and the reference potential, is applied to the plus terminal of the operational amplifier 24.

Furthermore, the fourth resistance R4 is connected between the minus terminal of the operational amplifier 24 and the output terminal. The resistance value of the first resistance R1 and the fourth resistance R4 is set to approximately 1:1 and the amplification factor of the first inverting circuit 23 is set to approximately 1 time. That is, the detection voltage VS1, which is input to the first inverting circuit 23, is output as an inverted voltage VS1R by inversion using the intermediate voltage which is applied to the plus terminal of the operational amplifier 24.

Meanwhile, the detection voltage VS2 which is output from the second buffer 22 is input to the second inverting circuit 25. The detection voltage VS2 is inverted by the second inverting circuit 25 as well as the detection voltage V1 which is inverted by the first inverting circuit 23 as described above, and the detection voltage VS2 is output as an inverted voltage VS2R. Incidentally, since the circuit formation of the second inverting circuit 25 is same as the circuit formation of first the inverting circuit 23, the same symbols apply to the same elements and their explanation is omitted.

The first switching circuit 26 for which switching control is done by the electronic control unit is connected to the output side of the first inverting circuit 23, and in the same way, the second switching circuit 27 for which switching control is done by the electronic control device is connected to the output side of the second inverting circuit 25. Furthermore, the output terminal of the first buffer 21 is connected to the first switching circuit 26 and the output terminal of the second buffer 22 is connected to the second switching circuit 27.

The first switching circuit 26 is provided with, for example, a single pole double throw type semiconductor switch, and the detection voltage VS1 or the inverted voltage VS1R is provided so as to output selectively for a latter step of the waveform shaping circuit 20. The second switching circuit 27 is also provided as well as the first switching circuit 26 described above, for example, a single pole double throw type semiconductor switch, and the detection voltage VS2 or the inverted voltage VS2R is provided so as to output selectively for a latter step of the waveform shaping circuit 20.

The switching timing of the first switching circuit 26 and the second switching circuit 27 is simultaneously controlled by the electronic control unit. In case that the detection voltage VS1 is selected by the first switching circuit 26, the detection voltage VS2 is selected by the second switching circuit 27. On the other hand, In case that the inverted voltage VS1R is selected by the first inverting circuit 26, the inverted voltage VS2R is selected by the second switching circuit 27.

The first switching circuit 26 and the second switching circuit 27 are connected to two input terminals of a differential amplifier circuit 30 via respectively a third buffer 28 and a fourth buffer 29. That is, the third buffer 28 and the fourth buffer 29 which disconnect circuit between: the differential amplifier circuit 30; and the first switching circuit 26 and the second switching circuit 27. The differential amplifier 30 performs, either a differential amplification of the detection voltage VS1 and the detection voltage VS2 which are input through each of the buffers 28 and 29 after passing through the first inverting circuit 23 and the second inverting circuit 25, or a differential amplification of the inverted voltage VS1R and the inverted voltage VS2R, and outputs a differentially amplified differential voltage VT3 to the electronic control unit.

From the third and fourth buffers 28 and 29, the detection voltage VS1 or the inverted voltage VS1R, which is respectively selected by the first switching circuit 26, is output to the differential amplifier circuit 30 as the voltage VT1, while the detection voltage VS2 or the inverted voltage VS2R, which is respectively selected by the second switching circuit 27, is output to the differential amplifier circuit 30 as the voltage VT2. The differential amplifier circuit 30 is a circuit provided with the operational amplifier 31 and a plurality of resistances R5 to R8. The differential voltage VT3 which is the output voltage is biased (for example, approximately 2.5V) by a direct current voltage same as the intermediate voltage of the first and second inverting circuit 23, 25 using the electrical source connected to the plus side via a resistance as described above. Incidentally, the gain of the differential amplifier circuit 30 can be increased or decreased by changing the resistance values of the resistances R5 to R8, the gain is set in response to the input condition of the electronic control unit.

The electronic control unit sets a target current of the motor based on the differential voltage VT3 which is output from the differential amplifier circuit 30, drives the motor according to the target current, and generates an auxiliary steering force. Consequently, the vehicle is steered by the auxiliary steering force.

Figure 3:
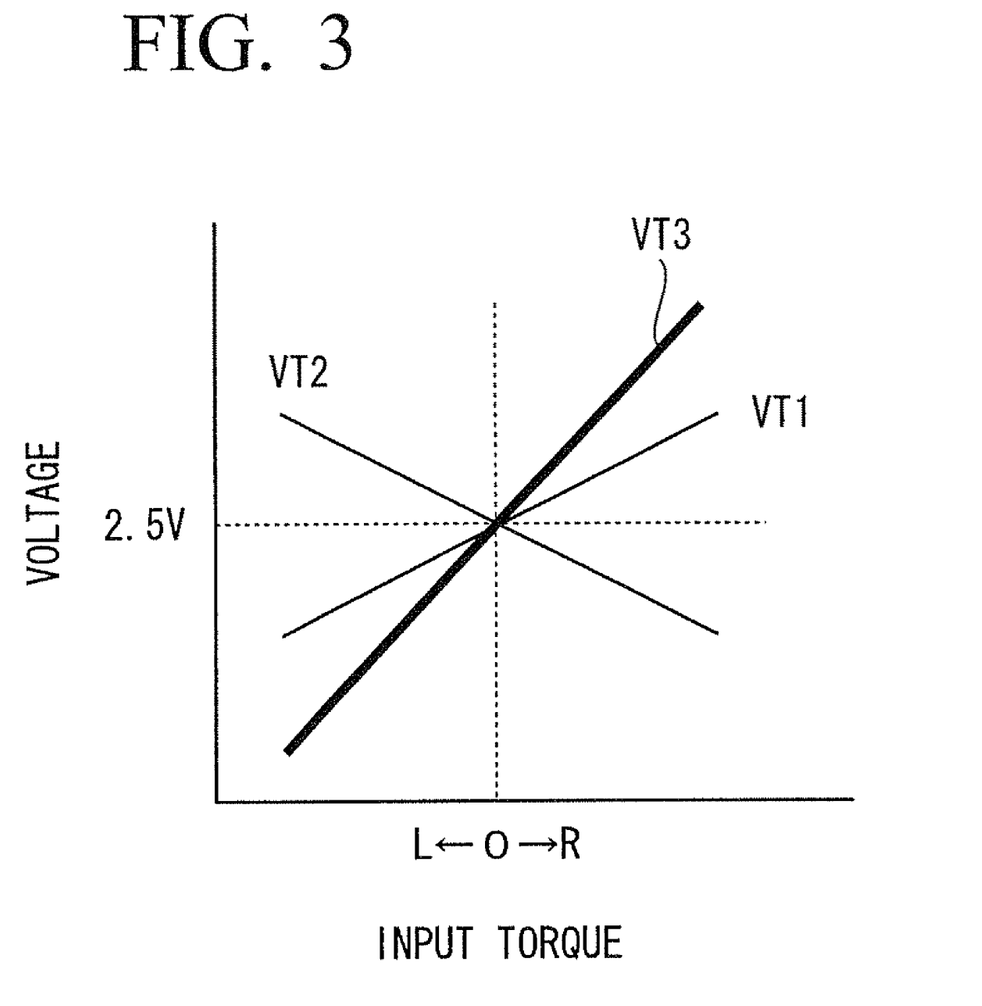
FIG. 3 is a graph showing a detection output waveform of the embodiment.

FIG. 3 shows a graph, with the vertical axis representing the voltage and the horizontal axis representing the input torque, of the voltages VT1, VT2 (in the figure, shown as a narrow line) and the differential voltage VT3 (in the figure, shown as a bold line). The graph of the voltage VT1 shows, the larger the input torque of the right (R) rotation to the rotating shaft 2, the larger the voltage, and on the other hand, the larger the input torque of the left (L) rotation to the rotating shaft 2, the smaller the voltage. In addition, the graph of the voltage VT2 is bilateral symmetric to torque 0 as reference of the voltage VT1 described above. That is, for the voltage VT2, the larger the input torque of the left (L) rotation to the rotating shaft 2, the larger the voltage, and on the other hand, the larger the input torque of the right (R) rotation to the rotation shaft 2, the smaller the voltage.

The graph of differential voltage VT3 shows differential amplification of the voltages VT1 and VT2 by the differential amplifier circuit 30 as described above. For the differential voltage VT3, the larger the input torque of the left (L) rotation, the smaller the voltage, and on the other hand, the larger the input torque of the right (R) rotation, the greater the voltage. The graph of the differential voltage VT3 becomes a graph with a steeper angle than the graph of the voltages VT1 and VT2. That is, since the voltage rate of change of the differential voltage VT3 with respect to the input torque is larger than the voltages VT1 and VT2, the differential voltage VT3 has a higher sensitivity than the voltages VT1 and VT2. Therefore, it is possible to determine more accurately the input torque by using the differential voltage VT3. Furthermore, from the differential voltage VT3, a minus input torque can be obtained in response to a minus voltage. Therefore, if whether the voltage value of the differential voltage VT3 is large or small by comparing with the reference voltage (for example, 2.5V) is checked, it is possible to immediately determine the direction of the input torque (L or R).

Next, a current waveform and a voltage waveform of the described above torque sensor is explained with reference to accompanying graphs (a), (b), and (c) of FIG. 4. Moreover, in graphs (a), (b), and (c) of FIG. 4, the horizontal axis is the common time axis for the respective graphs. In addition, in graphs (a), (b), and (c) of FIG. 4, an example is shown when the input torque of the left (L) rotation is applied to the rotating shaft 2.

Figure 4:
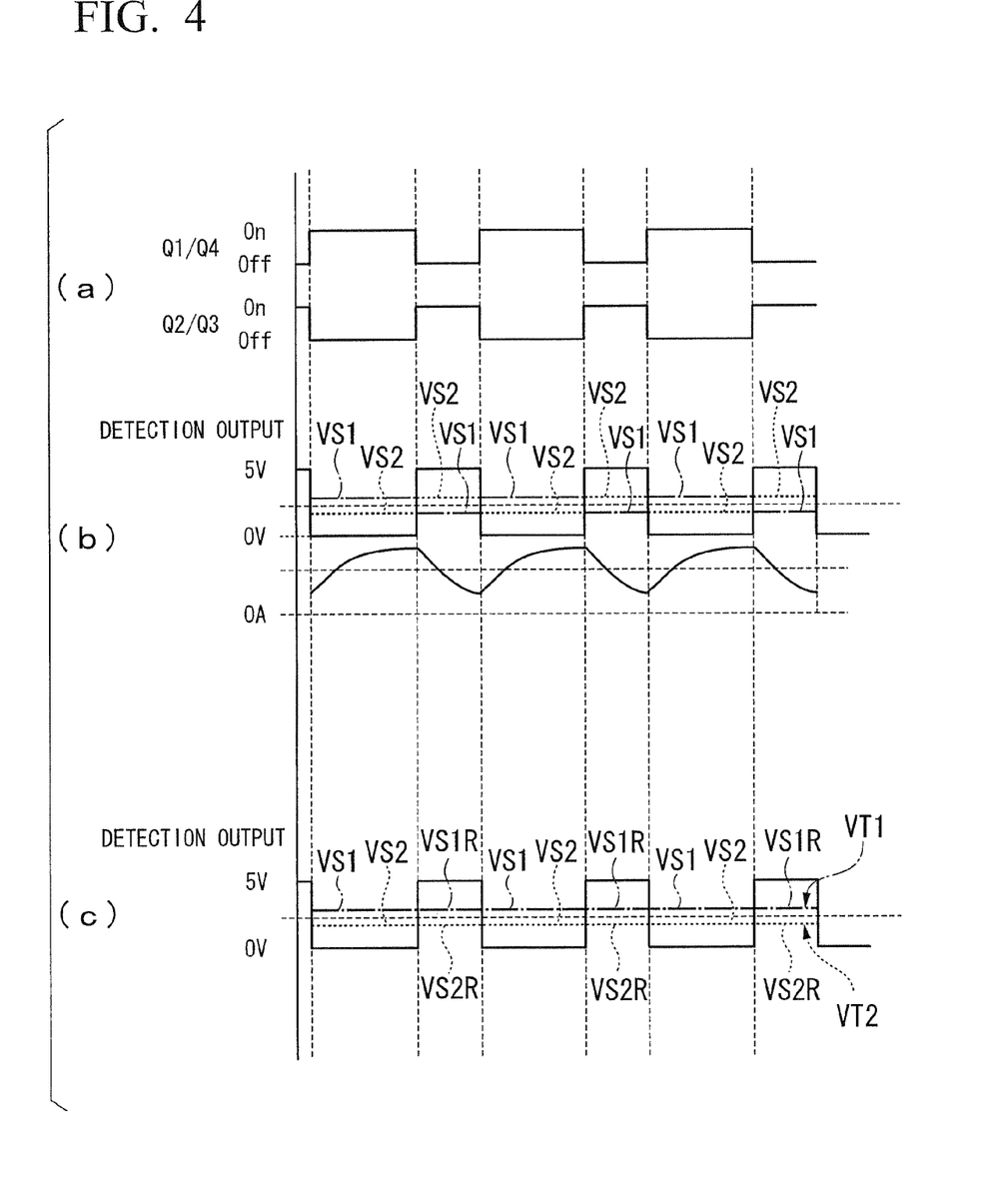
FIG. 4 shows graphs of the embodiment, where (a) is a graph of a control signal of the bridge circuit, (b) is a graph of a detection signal of the detection section, and (c) is a graph of a detection signal which is input to the differential amplifying circuit.

The graph (a) of FIG. 4 shows a control signal (hereinafter, called simply the Q1/Q4 signal) for PWM controlling each of the switching elements S1 and S4 of respective the first arm Q1 and the fourth arm Q4 which are output from the electronic control unit, and a control signal (hereinafter, simply called the Q2/Q3 signal) for PWM controlling each of the switching elements S2 and S3 of respective the second arm Q2 and the third arm Q3 which are output from the electronic control unit. The ON/OFF conditions are respectively inverted for the Q1/Q4 signal and the Q2/Q3 signal. The duty ratio of the Q1/Q4 signal is set to be larger than 0.5 by a predetermined duty ratio (for example, 0.05). Moreover, since the Q2/Q3 signal is the result of the inversion of the ON/OFF of the Q1/Q4 signal, the duty ratio is set to be smaller than 0.5 by a predetermined ratio.

The described above predetermined duty ratio is a duty ratio for superimposing a direct current component in a direction which cancels the earth magnetism of the southern and northern hemispheres with respect to the current which flows to the first detection coil 5 to the fourth detection coil 8. By changing and setting the duty ratio for PWM control with a predetermined duty ratio, positive and negative determination of the torque to be detected is not inverted by the earth magnetism.

The graph (a) of FIG. 4 shows the case when setting the Q1/Q4 signal duty ratio is larger than 0.5 by a predetermined duty ratio and setting a duty ratio for the Q2/Q3 signal that is smaller than 0.5 by a predetermined duty ratio. For example, considering the northern hemisphere, when the effect of the earth magnetism is cancelled by setting the Q1/Q4 signal duty ratio to be larger than 0.5 by a predetermined duty ratio and the Q2/Q3 signal duty ratio to be smaller than 0.5 by a predetermined duty ratio, but considering the southern hemisphere, the value is inverted with the Q1/Q4 signal duty ratio set to be smaller than 0.5 by a predetermined duty ratio and the Q2/Q3 signal duty ratio to be larger than 0.5 by a predetermined duty ratio.

In this way, setting a duty ratio by shifting only the predetermined duty ratio from 0.5, alternately switching by PWM control energizing periods of a current flowing from the point A to the point B, and from the point B to the point A, is respectively not the same and be biased in some direction. Accordingly, a direct current component is superimposed to the current in any direction from the point A to the point B or the point B to the point A of the detection section 10. Therefore, it is possible to generate a magnetic field which cancels the effect of the earth magnetism to the rotating shaft 2 by the direct current component.

The graph (b) of FIG. 4 respectively shows the voltage waveform (shown by the solid line on the top part of (b) of FIG. 4) between the point A of the detection section 10 and the reference voltage (earth; 0V), the waveform of the detection voltage VS1 (shown by the dashed line on the middle part of (b) of FIG. 4), the waveform of the detection voltage VS2 (shown by the broken line on the middle part of (b) of FIG. 4), and the waveform of the total current which flows to the detection section 10 from the bridge circuit 11 (shown by the solid line on the bottom part of (b) of FIG. 4). The voltage between the point A and the reference potential is synchronized with the ON/OFF timing of the Q2/Q3 voltage, and when ON, the voltage becomes 5V (Hi) and when OFF, the voltage becomes 0V (Lo). Moreover, the current which is directed to point B from point A of the detection section 10, for the waveform of the total current which flows to the detection section 10, is considered to be regular direction.

The directions of magnetization of the first magnetostrictive film 3 and the second magnetostrictive film 4 are respectively set along the direction which the magnetic line easily pass as shown in FIG. 1. For example, if the input torque of left rotation is acted to the rotating shaft 2, an inductance of the first detection coil 6 and the fourth detection coil 8 becomes relatively small, and an inductance of the second detection coil 6 and the third detection coil 7 becomes relatively large. The detection voltage VS1 becomes the voltage in which the electrical source voltage is divided by the first detection coil 5 and the third detection coil 7. Therefore, since the inductance of the third detection coil 7 is greater than that of the first detection coil 5, the detection voltage VS1 becomes higher than 2.5V which is the intermediate voltage of the electrical source voltage.

On the other hand, for the detection voltage VS2, the inductance of the second detection coil 6 becomes relatively large and the inductance of the fourth detection coil 8 becomes relatively small. Therefore, the described above detection voltage VS2 becomes smaller than the intermediate voltage by a voltage which is equal to a value which the detection voltage VS1 exceeds an intermediate voltage 2.5V. The voltage values of detection voltage VS1 and the detection voltage VS2 are replaced by switching of ON or OFF of the Q1/Q2 signal.

The total current which flows to the detection coil 10 gradually increases when the Q1/Q4 signal is ON. The increasing rate of the total current reaches a maximum after being ON, and gradually falls with the passage of time. While, when the Q1/Q4 signal is OFF, the total current which flows to the detection section 10 gradually decreases, and the decreasing rate falls as well as the increasing rate described above, the decreasing rate of the total current reaches a maximum after being OFF, and gradually falls with the passage of time. The ON period of the Q1/Q4 signal is longer than the OFF period as described above, in the course of performing PWM control, the current which flows to the first detection coil 5 to the fourth detection coil 8 is normally larger than 0 A and the direct current component corresponding to the difference between the ON period of the Q1/Q4 signal and the ON period of the Q2/Q3 signal is normally superimposed on the first detection coil 5 to the fourth detection coil 8.

The graph (c) of FIG. 4 shows the voltage waveform (shown by the solid line on (c) of FIG. 4) between the point A of the detection section 10 and the reference potential, and the voltage waveform of the voltage VT1 and the voltage waveform of VT2 which are input to the differential amplifier circuit 30. When the Q1/Q2 signal is ON, the voltage VT1 becomes the detection voltage VS1, and when OFF, the voltage VT1 becomes the inverted voltage VS1R. Therefore, the voltage VT1 becomes the waveform of a constant voltage equal to the detection voltage VS1 regardless of the ON/OFF condition of the Q1/Q2 signal. In addition, when the Q1/Q2 signal is ON, the voltage VT2 becomes the detection voltage VS2, and when OFF, the voltage VT2 becomes the inverted voltage VS2R. Therefore, the voltage VT2 becomes a waveform of a constant voltage equal to the detection voltage VS2 regardless of the ON/OFF condition of the Q1/Q2 signal. Moreover, the voltage waveform between the point A and the reference potential as shown in the graph (c) of FIG. 4 is equal to the voltage waveform between the point A and the reference potential as shown in the graph (b) of FIG. 4.

Consequently, according to the described above embodiment, when the current flows from the point B side of the detection section 10 by the bridge circuit 11, by detecting the torque based on the detection voltages VS1R and VS2R which are output signals of the inverting circuit, regardless of the ON/OFF condition, it is possible to detect the torque by obtaining voltage VT3 based on the constant voltages VT1 and VT2. Therefore, it is possible to omit a holding circuit that is used conventionally. As a result, it is possible to prevent sensitivity reduction in the detection signal of the detection section 10.

In addition, when using a conventional holding circuit, the output side becomes high impedance state and susceptible to disturbances, but by using a differential amplifier circuit 30 provided with operational amplifier 31 instead of the holding circuit, it is possible to maintain the output side at low impedance. As a result, it is possible to suppress the effect of disturbances.

Furthermore, one period is set to be longer than another period, either a period when the current flows from the point A side of the detection section 10, or a period when the current flows from the point B side of the detection section 10. Therefore, it is normally possible to superimpose direct current component on the current which flows to the first detection coil 5 to the fourth detection coil 8. As a result, it is normally possible to apply a bias magnetic field to the rotating shaft 2. Therefore, for example, in response to the destinations such as the northern hemisphere or southern hemisphere for which the direction of the earth magnetism differs on the surface of the earth, it is possible to apply a magnetic field with a stronger bias than the earth magnetism. Thus, the direction of the input torque detected with respect to the actual input torque is not inverted due to the effect of the earth magnetism and it is possible to detect a torque with higher reliability.

Moreover, the present invention is not limited to the described above embodiment, it is appropriate to use other than an electrical power steering device, for example, a steering device of a vehicle of a steering-by-wire system. That is, a steering-by-wire system means a steering system, and a steering device and a steering mechanism are mechanically separated. In the steering-by-wire system, in response to a steering torque which is applied for the steering device, a steering motor provided on the steering mechanism is droved and steering wheels of the vehicle are steered by the driving of the steering motor. It is possible to use the magnetostrictive torque sensor of the present invention for the detection of a steering torque applied for the steering device.

In addition, in the above embodiment, the case that the electrical source is set to be 5V and the intermediate voltage is set to be 2.5V is explained, but the electrical source is not limited to 5V and the intermediate voltage is not limited to 2.5V. Moreover, other than the previously described steering system, it is possible to use the magnetostrictive torque sensor of the present invention as a torque sensor which detects torque in the rotation direction which is acted to a shaft.

While preferred embodiment of the invention has been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A magnetostrictive torque sensor comprising:
  a magnetostrictive film for which magnetic properties change in response to a magnitude of a torque acted to a shaft;
  a detection coil which detects variation of the magnetic properties of the magnetostrictive film;
  a current direction switching device which can invert a direction of a current which flows to the detection coil with respect to each predetermined time; and
  an inversion device which synchronizes with an inversion timing of the current by the current direction switching device and inverts a detection signal of the detection coil, wherein:
  when the current flows in a direction from one side to another side of the detection coil by the current direction switching device, the torque acted to the shaft is detected based on an input signal of the inversion device; and
  when the current flows in an inverse direction from another side to one side of the detection coil by the current direction switching device, the torque acted to the shaft is detected based on an output signal of the inversion device.

2. The magnetostrictive torque sensor according to claim 1, wherein
  the current direction switching device sets one period to be longer than another period, either a period when the current flows in the direction from one side to another side of the detection coil, or a period when the current flows in the inverse direction from another side to one side of the detection coil.

3. The magnetostrictive torque sensor according to claim 1, further comprising
a buffer which disconnects circuit between the inversion device and the detection coil.

4. The magnetostrictive torque sensor according to claim 3, further comprising:

a differential amplifier which differentially amplifies the detection signal that has passed through the inversion device; and a buffer which disconnects circuit between the differential amplifier and the inversion device.

* * * * *